(12) United States Patent
Patulea

(10) Patent No.: US 10,656,222 B2
(45) Date of Patent: May 19, 2020

(54) VARIABLE GAIN AMPLIFICATION FOR LINEARIZATION OF NMR SIGNALS

(71) Applicant: Sebastian Patulea, Somerville, MA (US)

(72) Inventor: Sebastian Patulea, Somerville, MA (US)

(73) Assignee: WAVEGUIDE CORPORATION, Cambridge, MA (US)

( * ) Notice: Subject to any disclaimer, the term of this patent is extended or adjusted under 35 U.S.C. 154(b) by 138 days.

(21) Appl. No.: 15/842,183

(22) Filed: Dec. 14, 2017

(65) Prior Publication Data

US 2018/0172786 A1   Jun. 21, 2018

Related U.S. Application Data

(60) Provisional application No. 62/434,132, filed on Dec. 14, 2016.

(51) Int. Cl.
*G01R 33/36* (2006.01)
*G01R 33/565* (2006.01)

(52) U.S. Cl.
CPC ... *G01R 33/3621* (2013.01); *G01R 33/56554* (2013.01)

(58) Field of Classification Search
CPC ............. G01R 33/3621; G01R 33/56554
See application file for complete search history.

(56) References Cited

U.S. PATENT DOCUMENTS

| | | | |
|---|---|---|---|
| 5,140,268 A * | 8/1992 | Chan | G01R 33/3607 324/307 |
| 5,194,809 A | 3/1993 | Lew | |
| 6,448,770 B1 | 9/2002 | Liu et al. | |
| 7,529,398 B2 * | 5/2009 | Zwirn | A61B 5/0046 382/131 |
| 7,660,452 B2 * | 2/2010 | Zwirn | A61B 5/0046 382/131 |
| 7,664,303 B2 * | 2/2010 | Zwirn | A61B 5/0046 382/131 |
| 2008/0204027 A1 | 8/2008 | Luedeke et al. | |
| 2009/0129646 A1 * | 5/2009 | Zwirn | A61B 5/0046 382/128 |
| 2009/0129652 A1 * | 5/2009 | Zwirn | A61B 5/0046 382/131 |
| 2009/0237084 A1 * | 9/2009 | Itskovich | G01V 3/28 324/339 |
| 2010/0141257 A1 * | 6/2010 | Graesslin | G01R 33/3607 324/314 |
| 2010/0191109 A1 * | 7/2010 | Fukutani | A61B 5/0059 600/437 |

(Continued)

OTHER PUBLICATIONS

International Search Report, for International Application No. PCT/US2017/066396, dated Mar. 7, 2018 , 10 pages.

*Primary Examiner* — Dixomara Vargas
(74) *Attorney, Agent, or Firm* — Morgan, Lewis & Bockius LLP

(57) ABSTRACT

Various approaches of amplifying an NMR signal in response to a transmitted NMR pulse include estimating the characteristic time associated with the NMR signal; transmitting the NMR pulse to the sample and receiving the NMR signal therefrom; and applying a time-dependent amplifier gain to the received NMR signal based at least in part on the estimated characteristic time.

22 Claims, 10 Drawing Sheets

(56) References Cited

U.S. PATENT DOCUMENTS

| | | | |
|---|---|---|---|
| 2011/0077526 A1* | 3/2011 | Zwirn ................. | A61B 5/0095 600/459 |
| 2013/0079641 A1* | 3/2013 | Zwirn ................. | A61B 5/0095 600/447 |
| 2013/0193969 A1 | 8/2013 | Grunewald et al. | |
| 2013/0245440 A1* | 9/2013 | Fokkenrood ......... | A61B 8/0883 600/437 |
| 2014/0303498 A1* | 10/2014 | Watanabe ............ | A61B 5/0095 600/437 |
| 2017/0070827 A1* | 3/2017 | Guo ..................... | H04R 25/356 |
| 2018/0041845 A1* | 2/2018 | Kunzle ................ | H04R 25/356 |

* cited by examiner

VARIABLE GAIN AMPLIFICATION FOR LINEARIZATION OF NMR SIGNALS

CROSS-REFERENCE TO RELATED APPLICATION

This application claims priority to and the benefit of, and incorporates herein by reference in its entirety, U.S. Provisional Patent Application No. 62/434,132, which was filed on Dec. 14, 2016.

FIELD OF THE INVENTION

The field of the invention relates, generally, to nuclear magnetic resonance (NMR) systems and, more particularly, to systems and methods for providing variable gain amplification of NMR signals.

BACKGROUND

Nuclear magnetic resonance (NMR) is a well-known analytic technique that has been used in a number of fields, such as spectroscopy, bio-sensing and medical imaging. In general, an NMR device includes transceiver circuits to transmit signals to a tested sample and receive echo signals therefrom. The echo signals are then analyzed to obtain imaging and/or material information of the sample. The NMR echo signals, however, are typically very small (on the order of microvolts) and represent free induction decay; this can pose a considerable challenge to the NMR system. For example, the sensitivity of the NMR transceiver has to be sufficient in order to detect the small echo signals. In addition, the NMR transceiver has to amplify the received NMR signals to a level sufficient to permit processing for analysis.

Conventionally, the NMR transceiver includes an amplifier of a fixed gain for amplifying the detected NMR signals. Fixed-gain amplification, however, may not be sufficient to amplify the damped portions of the NMR decay signals to a desired level suitable for signal processing. In addition, fixed-gain amplification may result in saturation of the less-damped portions of the NMR signals, thereby providing inaccurate NMR analysis. Accordingly, there is a need for an approach that ensures the detected NMR echo signals, particularly the damped portions, are amplified to a level sufficient to permit analysis without saturation of the less-damped portions of the NMR echo signals.

SUMMARY

Embodiments of the present invention provide systems and methods for applying a time-dependent amplifier gain to an NMR signal having a free induction decay. In various embodiments, the decay signals have damped and less-damped portions (as defined below), and the time-dependent gain amplifies the damped portion of the decay signal to a greater degree than the less-damped portion. For example, the time-dependent amplifier gain may be a gradually (e.g., exponentially) increasing gain. As a result, the damped portion is amplified to a desired level (e.g., on the order of millivolts) suitable for signal processing and analysis, while the less-damped portion is amplified to a lesser degree so as to avoid signal saturation. In one embodiment, after the NMR signal is processed and transmitted to a controller in the NMR system, the controller computationally applies to the amplified signal a gain function that is inverse to the applied amplifier gain, and then analyzes the resulting signal to obtain information (such as the characteristic time and/or Larmor frequency) associated with the NMR signal; this information may be used, for example, to facilitate chemical composition analysis, medical imaging, and/or bio-sensing.

In some embodiments, the time-dependent amplifier gain may have a profile different from the gradually increasing exponent. For example, the amplifier gain may be increased in a step-wise manner, and the overall profile of the discrete gains is approximated as an exponential increase; this may advantageously lessen the design burden of amplifier stages implemented in the NMR system. In addition, the amplifier gain applied to the received NMR signals may be dynamically adjusted during NMR measurements. For example, the characteristic of the time-dependent amplifier gain (such as the time constant of the exponential gain or the discrete increase of the gain) applied to the currently received signal may be determined based on the characteristic time(s) of the previously received NMR signal(s). This approach may advantageously enable the damped portions of the received NMR echo signals to be amplified to a greater degree (compared with fixed-gain amplification) based on the actual, "real-time" measurements of the sample, providing greater accuracy and/or higher resolution.

Accordingly, in one aspect, the invention pertains to a method of amplifying an NMR signal in response to a transmitted NMR pulse. In various embodiments, the method includes estimating a characteristic time associated with the NMR signal; transmitting the NMR pulse to a sample and receiving the NMR signal therefrom; and applying a time-dependent amplifier gain to the received NMR signal based at least in part on the estimated characteristic time. In one implementation, the characteristic time is estimated based on one or more previous NMR measurements of the sample. In addition, the method may further include computing the second characteristic time associated with the amplified NMR signal. For example, the second characteristic time may be computed by applying an inverse gain function to the amplified NMR signal. In some embodiments, the method further includes analyzing at least a portion of the amplified NMR signals occurring after passage of the second characteristic time.

In addition, the method may further include transmitting the second NMR pulse to the sample and receiving the second NMR signal therefrom; and applying the second time-dependent amplifier gain to the second NMR signal based at least in part on the second characteristic time. In one embodiment, the time-dependent amplifier gain includes an exponential gain profile. The time constant of the exponential gain profile and the characteristic time may be within an order of the magnitude. In another embodiment, the time-dependent amplifier gain includes a series of discrete gain increases. The profile of the series of discrete gain increases may include an exponent.

In another aspect, the invention relates to an NMR apparatus including a transceiver for transmitting an NMR pulse to a sample and receiving an NMR signal therefrom; and a controller configured to (i) estimate a characteristic time associated with the NMR signal; (ii) cause the transceiver to transmit the NMR pulse to the sample and receive the NMR signal therefrom; and (iii) cause a time-dependent amplifier gain to be applied to the received NMR signal based at least in part on the estimated characteristic time. In addition, the NMR apparatus may further include a variable-gain amplifier for applying the time-dependent amplifier gain to the received NMR signal. In one implementation, the variable-gain amplifier is a programmable-gain amplifier.

In some embodiments, the NMR apparatus further includes a pulse-sequence generator having a gain setting associated with gains generated by the variable-gain amplifier. The pulse-sequence generator may generate multiple NMR pulses; the amplitude difference between adjacent pulses may be determined based at least in part on a step size of the gains generated by the variable-gain amplifier. In addition, the controller may be further configured to estimate the characteristic time based on one or more previous NMR measurements of the sample. In various embodiments, the controller is further configured to compute the second characteristic time associated with the amplified NMR signal. In addition, the controller may be further configured to computationally apply an inverse gain function to the amplified NMR signal. In one embodiment, the controller is further configured to analyze at least a portion of the amplified NMR signals occurring after passage of the second characteristic time.

In some embodiments, the controller is further configured to cause the transceiver to transmit the second NMR pulse to the sample and receive the second NMR signal therefrom; and cause the second time-dependent amplifier gain to be applied to the second NMR signal based at least in part on the second characteristic time. In one embodiment, the time-dependent amplifier gain includes an exponential gain profile. The time constant of the exponential gain profile may have the same order of the magnitude of the characteristic time. In another embodiment, the time-dependent amplifier gain includes a series of discrete gain increases. The profile of the series of discrete gain increases may include an exponent.

Another aspect of the invention relates to a method of dynamically varying gain amplification of received NMR signals in response to transmitted NMR pulses, each received NMR signal corresponding to a transmitted NMR pulse. In various embodiments, the method includes (i) transmitting the first one of the NMR pulses to a sample and receiving therefrom the first one of the NMR signals; (ii) determining a characteristic time associated with the first one of the NMR signals; (iii) transmitting the second one of the NMR pulses to the sample and receiving therefrom the second one of the NMR signals; and (iv) applying a time-dependent amplifier gain to the received second one of the NMR signals based at least in part on the determined characteristic time.

In yet another aspect, the invention pertains to an NMR apparatus including a transceiver for transmitting NMR pulses to a sample and receiving NMR signals therefrom, each NMR signal corresponding to a transmitted NMR pulse; and a controller. In various embodiments, the controller is configured to (i) cause the transceiver to transmit the first one of the NMR pulses to the sample and receive therefrom the first one of the NMR signals; (ii) determine a characteristic time associated with the first one of the NMR signals; (iii) cause the transceiver to transmit the second one of the NMR pulses to the sample and receive therefrom the second one of the NMR signals; and (iv) cause the transceiver to apply a time-dependent amplifier gain to the received second one of the NMR signals based at least in part on the determined characteristic time.

In general, as used herein, the term "substantially" means ±10%, and in some embodiments, ±5%. In addition, reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 1A:
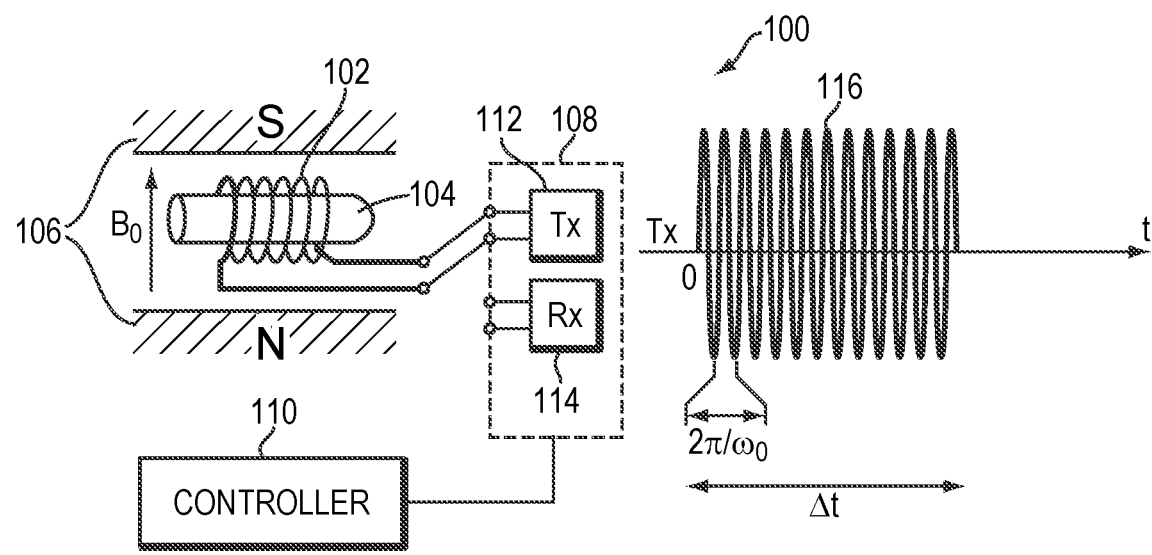
FIGS. 1A and 1B illustrate an exemplary NMR system in accordance with various embodiments.
Figure 1B:
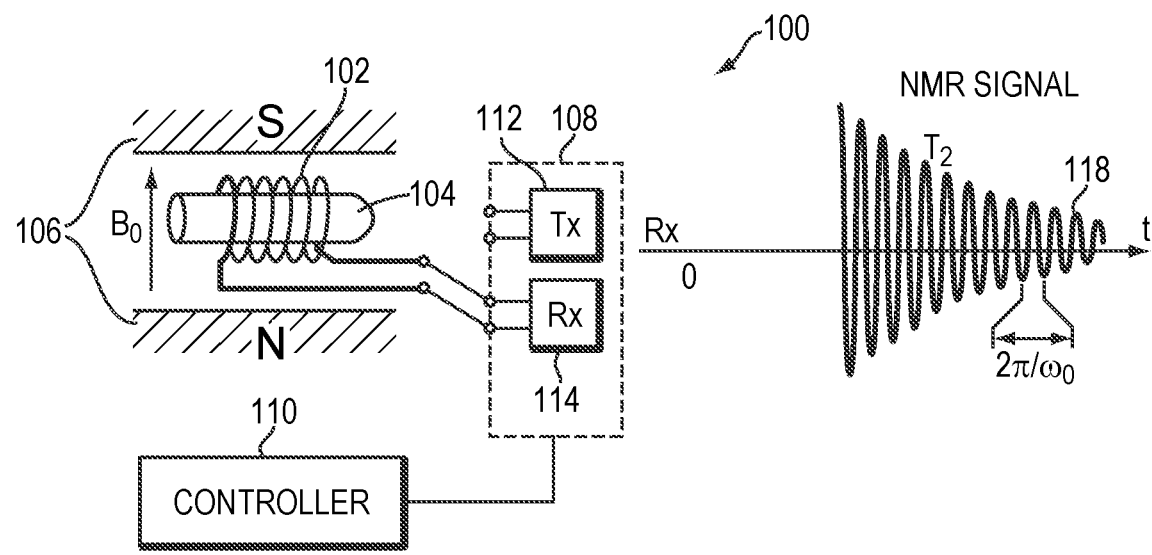

FIGS. 1A and 1B illustrate an exemplary NMR system 100 in accordance with various embodiments of the present invention including an NMR coil 102 surrounding a sample 104 being analyzed, a magnet 106 for generating a static magnetic field across the sample 104 and the coil 102, an RF transceiver 108 coupled to the NMR coil 102, and a controller 110 for controlling operation of the RF transceiver 108. In one implementation, the transceiver 108 includes a transmitter (Tx) portion 112 for generating and transmitting RF signals to the sample 104 and a receiver (Rx) portion 114 for receiving echo signals from the sample 104.

Referring to FIG. 1A, during NMR measurements, the magnet 106 is activated to generate a substantially homogeneous magnetic field $B_0$ across the sample 104; individual magnetic moments of the spins in the sample 104 may attempt to align with the applied field $B_0$. As a result, the magnetic moments of all the nuclei in the sample sum to a net magnetic moment that precesses about the axis of the field $B_0$ at a characteristic Larmor frequency, $\omega_0$, satisfying $\omega_0 = \gamma B_0$, where $\gamma$ is a gyromagnetic ratio. Because different nuclei have different values of the gyromagnetic ratio, measuring the Larmor frequency of the sample 104 allows material properties (e.g., the chemical composition) of the sample 104 to be revealed. In various embodiments, to observe precession of the net magnetic moment, the controller 110 causes the transmitter 112 to transmit an RF signal 116 (typically comprising a pulse sequence) having a resonant frequency substantially close (e.g., within ±10% or ±5%) to the Larmor frequency $\omega_0$ to the coil 102; the coil 102 then generates an RF magnetic field that causes the net magnetic moment of the nuclei in the sample 104 to be "tipped" away from the axis of the static field $B_0$. Typically, the RF magnetic field has a time-dependent magnitude and is generated in a plane perpendicular to the axis of the static field $B_0$. Referring to FIG. 1B, after a predetermined time duration, $\Delta t$, the transmitter 112 stops transmission of the RF excitation signal 116, and the coil 102 is switched via, for example, a mechanical switch or an electrical switch (e.g., a transistor) to the receiver 114 for receiving the echo signals from the sample 104. Upon stopping the RF excitation, the nuclear spins within the sample 104 precess around the $B_0$-axis at the Larmor frequency $\omega_0$; this induces a corresponding signal oscillation. The nuclear spins then slowly lose phase coherence via spin-spin interactions, which manifest themselves in a macroscopic average as an exponential relaxation or damping signal 118 (referred to as "free induction decay") in the precession of the net magnetic moment. The oscillation and relaxation of the NMR signal can be detected by the coil 102. Because the spin-spin interactions are peculiar to the material of the sample 104 being tested, the characteristic time, commonly referred to as $T_2$, of the relaxation signal is also material-specific. Thus, by measuring the Larmor frequency $\omega_0$ (e.g., for spectroscopy) and/or characteristic time $T_2$ (e.g., for relaxometry), NMR techniques can be used as an analytic tool in a number of fields, including but not limited to chemical composition analysis, medical imaging, and bio-sensing. An exemplary NMR system is described in U.S. Pat. No. 8,643,368, the entire disclosure of which is hereby incorporated by reference.

Figure 2A:
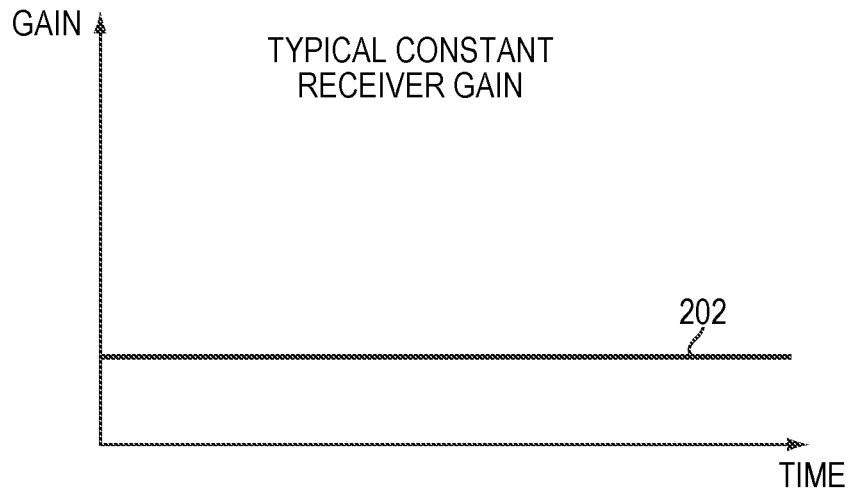
FIGS. 2A and 2B depict amplifier gain applied to a received NMR signal in accordance with the prior art.
Figure 2B:
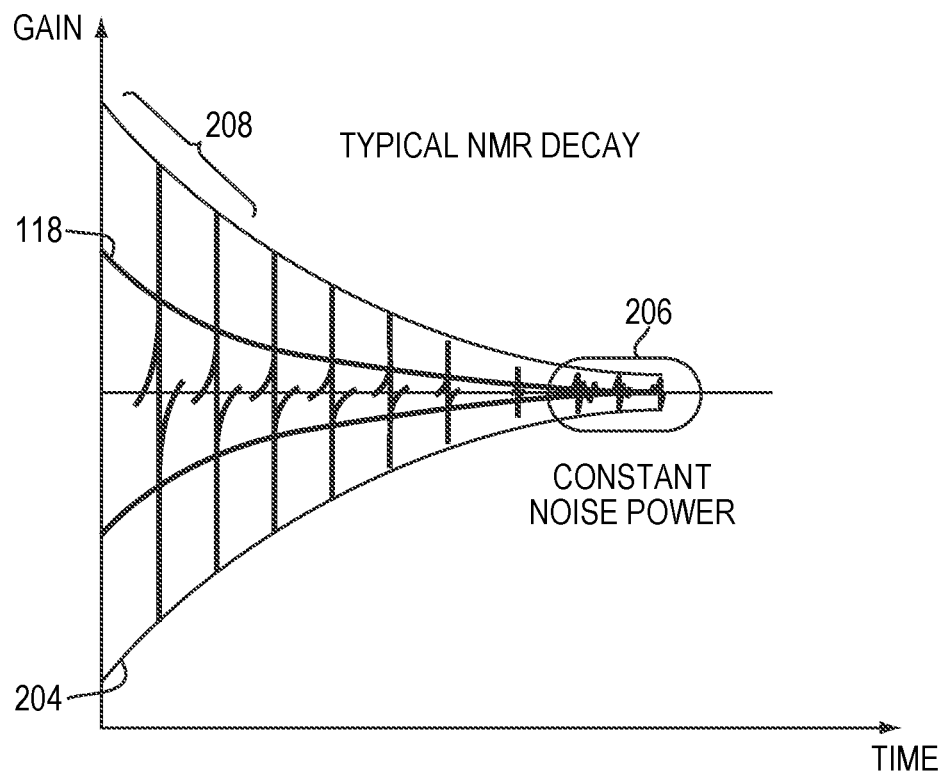

Typically, the detected NMR signals are very small (on the order of $\mu V$); therefore, it may be necessary to amplify the received signals to a desired level (e.g., on the order of mV) where they can be processed by circuitry (e.g., an analog-to-digital converter (ADC)) in the NMR system 100 and analyzed by the controller 110. In a conventional approach, with reference to FIGS. 2A and 2B, the NMR system 100 includes an amplifier to generate a fixed, constant gain 202 for amplifying the received NMR signal 118. The fixed gain 202 is typically tuned based on the material properties of the tested sample 104 and/or the NMR coil 102. After amplification, the NMR signal 204 still represents an exponential decay in the time domain; thus, the damped portion 206 of the amplified NMR signal 204 may still be too weak to be processed and/or analyzed. Although it may be possible to increase the fixed gain 202 to a level that allows sufficient amplification of the damped portion 206, the increased fixed gain 202 may cause saturation of the less-damped portion 208 of the amplified NMR signal 204; analysis of a saturated (and thereby distorted) NMR signal may provide inaccurate information about the sample 104. As understood herein, the less-damped portion may include the oscillations received within a decay time or a half-life time of the NMR signal. Alternatively, the less-damped portion may include the initially received several oscillations (e.g., 2, 5, 8 or 10 oscillations) of the NMR signal. The damped portion typically includes some or all oscillations of the NMR signal outside the less-damped portion.

Figure 3A:
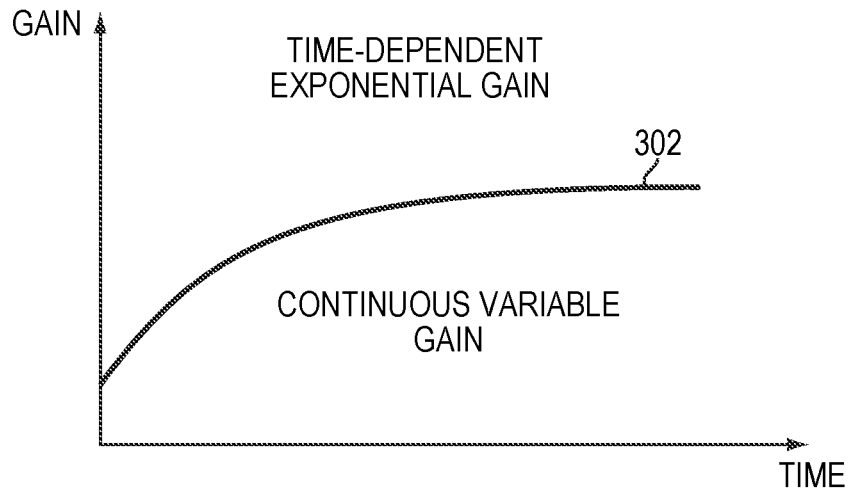
FIGS. 3A and 3B depict an exemplary time-dependent amplifier gain applied to a received NMR signal in accordance with various embodiments.
Figure 3B:
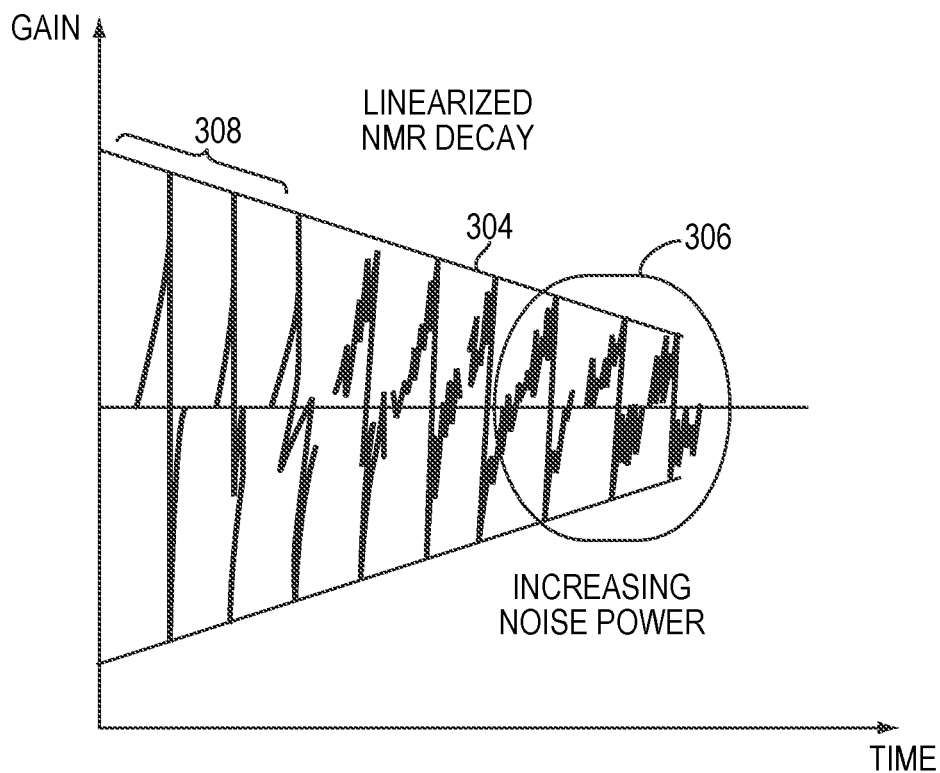

To overcome this challenge, in various embodiments, a time-dependent amplifier gain is applied to the received NNR signal 118 so as to provide variable amplification to the damped and less-damped potions thereof. Preferably, the amplifier gain applied to the damped portion is larger than that applied to the less-damped portion; this advantageously amplifies the damped portion to a level suitable for processing and analysis while avoiding saturation of the less-damped portion. For example, referring to FIGS. 3A and 3B, an amplifier gain 302 that gradually, continuously increases over time with an exponential gain profile may be applied to the received NMR signal 118. As a result, the measured NMR decay signal 118 is effectively linearized by the exponential gain (as shown by the amplified signal 304). This approach thus allows the damped signal to be amplified to a desired level (the amplified damped portion 306) suitable for processing without distorting the less-damped portion 308. In one embodiment, the time constant of the exponential gain profile 302 is determined based on the expected characteristic time $T_2$ of the NMR echo signal. For example, the time constant of the exponential profile 302 and the expected characteristic time $T_2$ may have the same order of magnitude; in some embodiments, the difference therebetween may be smaller, e.g., less than 100%, 50%, or 10%. Because the characteristic time $T_2$ is material-specific, its expected value can be acquired empirically via any suitable approach prior to the NMR measurements and/or from known literature or a lookup table.

Figure 3C:
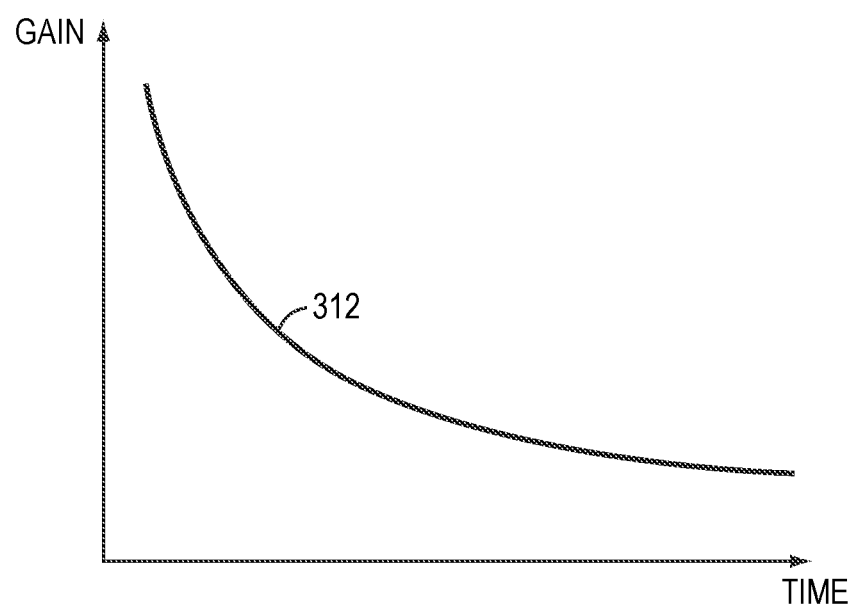
FIG. 3C depicts an exemplary inverse gain function applied to an amplified NMR signal for analysis in accordance with various embodiments.

Significant amplification of the damped portion 306 such that it can be incorporated in the detected NMR signal for data analysis may have several advantages. For example, the NMR signal in the time domain may be converted using a Fourier transform to a spectrum in the frequency domain. Incorporation of the damped signal 306 may yield a better resolution in the NMR spectrum. In various embodiments, the amplified NMR signal 304 is subsequently processed (e.g., by an ADC) and analyzed by the controller 110 to obtain an image or other information (e.g., the composition) of the sample 104. For example, to acquire the actual characteristic time $T_2$ of the received NMR signal 118, in one implementation (with reference to FIG. 3C), the controller 110 first computationally applies to the amplified, linearized signal 304 a gain function 312 inverse to the exponential profile 302 and then, based on the resulting signal, computes the actual characteristic time $T_2$ of the received signal 118. By taking into account the time-dependent profile of the amplifier gain to provide accurate information about the sample 104, this approach allows the received NMR signal 118 (in particular, the damped portion thereof) to be sufficiently amplified to a level sufficient to facilitate processing by NMR circuitry (e.g., the ADC) and subsequent analysis by the controller 110.

Figure 4A:
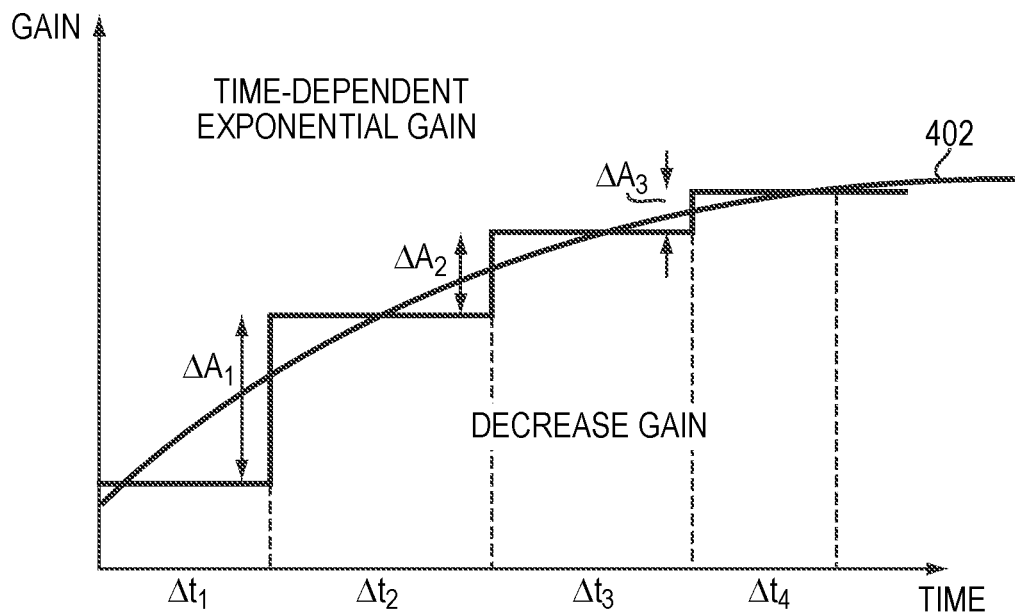
FIGS. 4A and 4B depict another exemplary time-dependent amplifier gain applied to a received NMR signal in accordance with various embodiments.
Figure 4B:
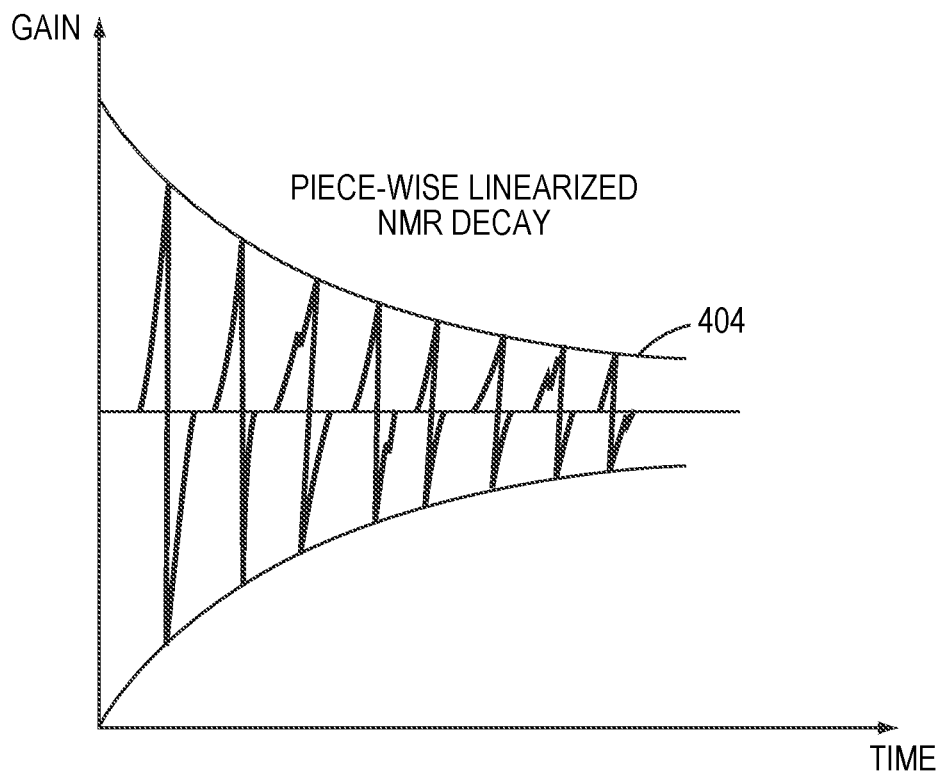
Figure 4C:
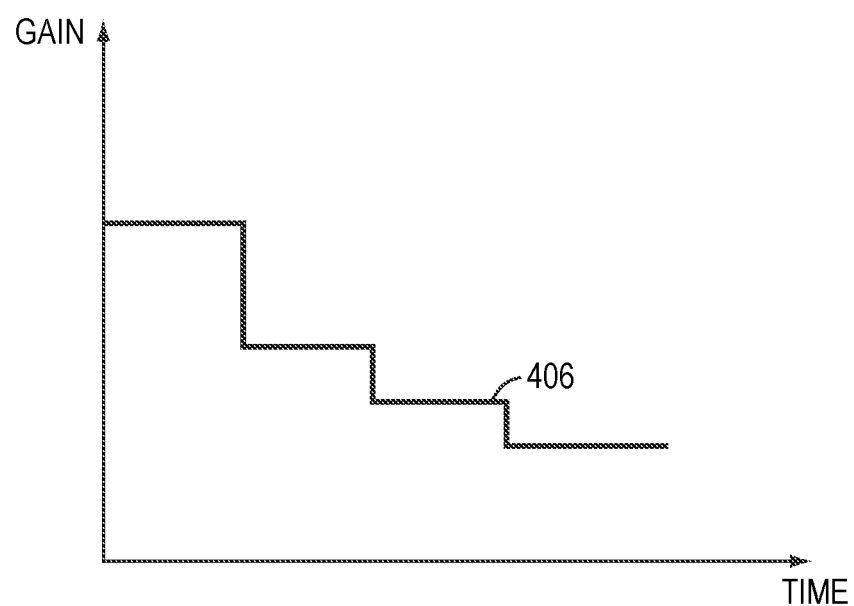
FIG. 4C depicts an exemplary inverse gain function applied to an amplified NMR signal for analysis in accordance with various embodiments.

In various embodiments, the amplifier gain is increased in a discrete manner over time to lessen the design burden associated with the amplifier. For example, referring to FIG. 4A, the amplifier gain may be increased in a step-wise manner; the gain difference between adjacent steps may be uniform or may vary among steps. In addition, the time duration of each step may be uniform or may vary. For example, the time duration of each step may be the same—i.e., $\Delta t_1 = \Delta t_2 = \Delta t_3 = \Delta t_4$, whereas the gain increase between steps may be gradually decreased—i.e., $\Delta A_1 > \Delta A_2 > \Delta A_3$. In one embodiment, the overall profile 402 of the discrete gains is approximated as an exponential increase. This gain configuration may effectively linearize the received NMR signal 118 in a piece-wise manner (as exemplified by the amplified signal 404 in FIG. 4B); this also generates a desired amplification of the measured NMR signal 118—i.e., the damped portion of the received NMR signal is amplified to a greater degree than the less-damped portion, allowing the damped signal to be processed without saturation of the less-damped signal. Again, upon receiving the amplified signal 404, the controller 110 may apply thereto an inverse gain function 406 (with reference to FIG. 4C) so as to compute the actual characteristic time $T_2$ of the received signal 118.

It should be noted that the configurations of the amplifier gain profiles 302, 402 described herein are for illustration only; the present invention is not limited to such configurations. One of ordinary skill in the art will understand that variations are possible, so long as the time-dependent amplifier gain applied to the damped portion is larger than that applied to the less-damped portion; any amplifier gain profiles satisfying this condition are thus within the scope of the present invention.

Figure 5:
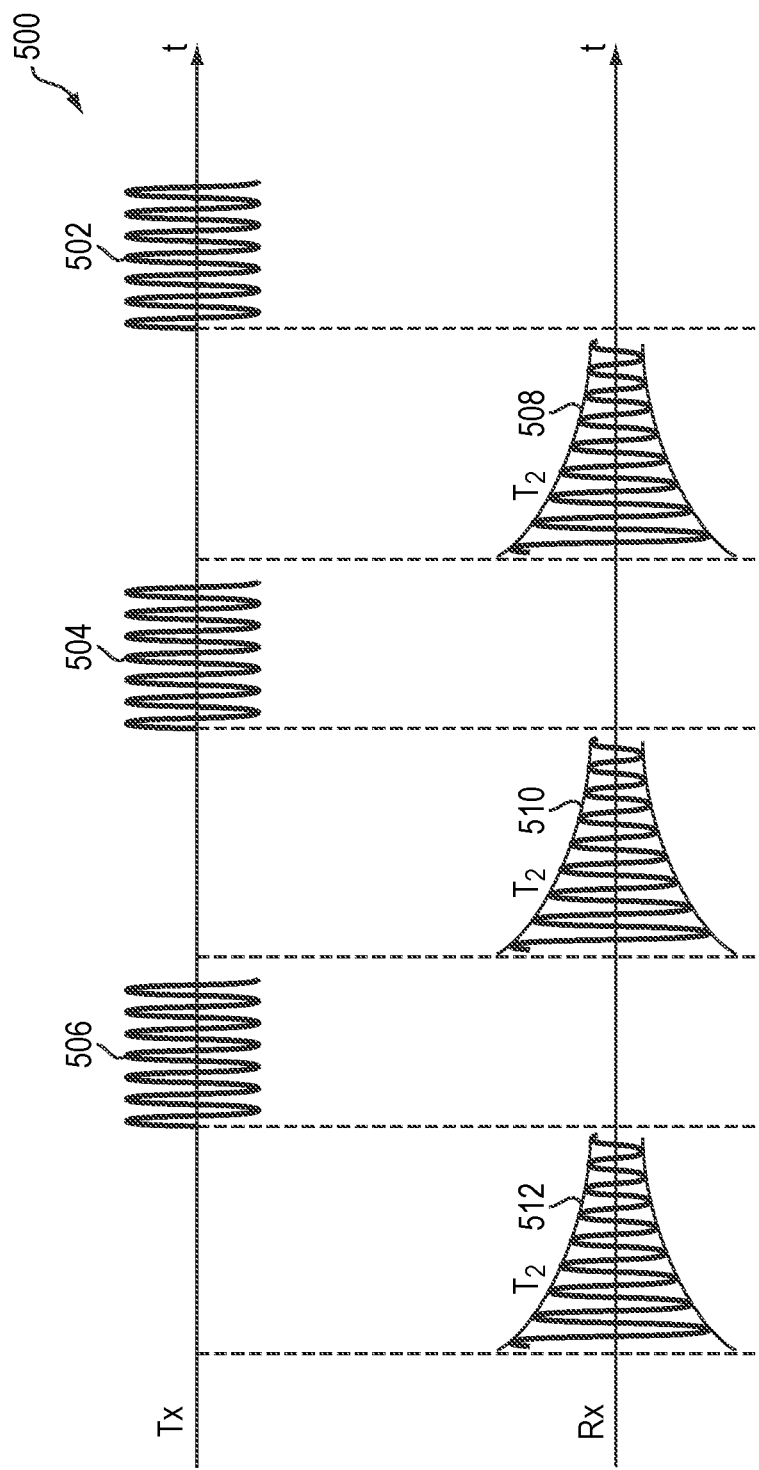
FIG. 5 depicts an approach for dynamically adjusting the amplifier gain applied to the received signals during NMR measurements in accordance with various embodiments.

In various embodiments, the amplifier gain applied to the received NMR signals 118 is dynamically adjusted during the NMR measurements. For example, referring to FIG. 5, the transmitter 112 may generate and deliver to the coil 102 a pulse sequence 500 consisting of multiple pulses 502-506. At the end of the first pulse 502, the coil 102 may be disconnected from the transmitter 102 and connected to the receiver 114, via, for example, a switch, for receiving an echo signal 508 from the sample 104. Upon receiving the echo signal 508, the controller 110 may adjust the time-dependent amplifier gain based on an expected characteristic time $T_{2exp}$ associated with the tested sample in accordance with the approach described above. Alternatively, the amplifier gain may be a fixed value that is sufficient to amplify the damped portion for signal processing without saturating the less-damped portion of the NMR signal. The controller 110 then computes the actual characteristic time $T_2$ associated with the measured NMR echo signal 508 by taking into account the amplifier gain (e.g., by applying an inverse gain function as described above). In addition, the controller 110 may convert the signal 508 to the frequency domain for spectral analysis.

In some embodiments, after the echo signal 508 is received, the coil 102 is disconnected from the receiver 114, and reconnected to the transmitter 112 for transmitting a subsequent pulse 504 to the sample 104. Again, the receiver 114 may be reconnected to the coil 102 at the end of the pulse 504 in order to detect the echo signal 510. The newly received echo signal 510 may be amplified with an exponential gain whose time constant is determined based on—e.g., matches or is scaled with respect to—the measured characteristic time $T_2$ of the previously detected NMR echo signal 508. Similarly, the characteristic time $T_2$ of the current echo signal 510 may determine the time constant of the exponential gain applied to the next received echo signal 512. In some embodiments, the amplifier gain applied to the currently received NMR signal is determined based on multiple preceding measurements. For example, the time constant of the exponential gain applied to the echo signal 512 may determine based on an average of the time constants of the signal 508 and signal 510. By dynamically adjusting the amplifier gain applied to the received NMR signals (particularly the damped portions) based on the "real-time" measurements of the sample 104, each received NMR signal may be optimally amplified to provide accurate information about the sample. In addition, this approach may relax the performance requirements of the ADC that often is used to digitize the amplified signals by optimizing the signal amplitudes, thereby reducing the necessary dynamic range of the ADC.

Figure 6A:
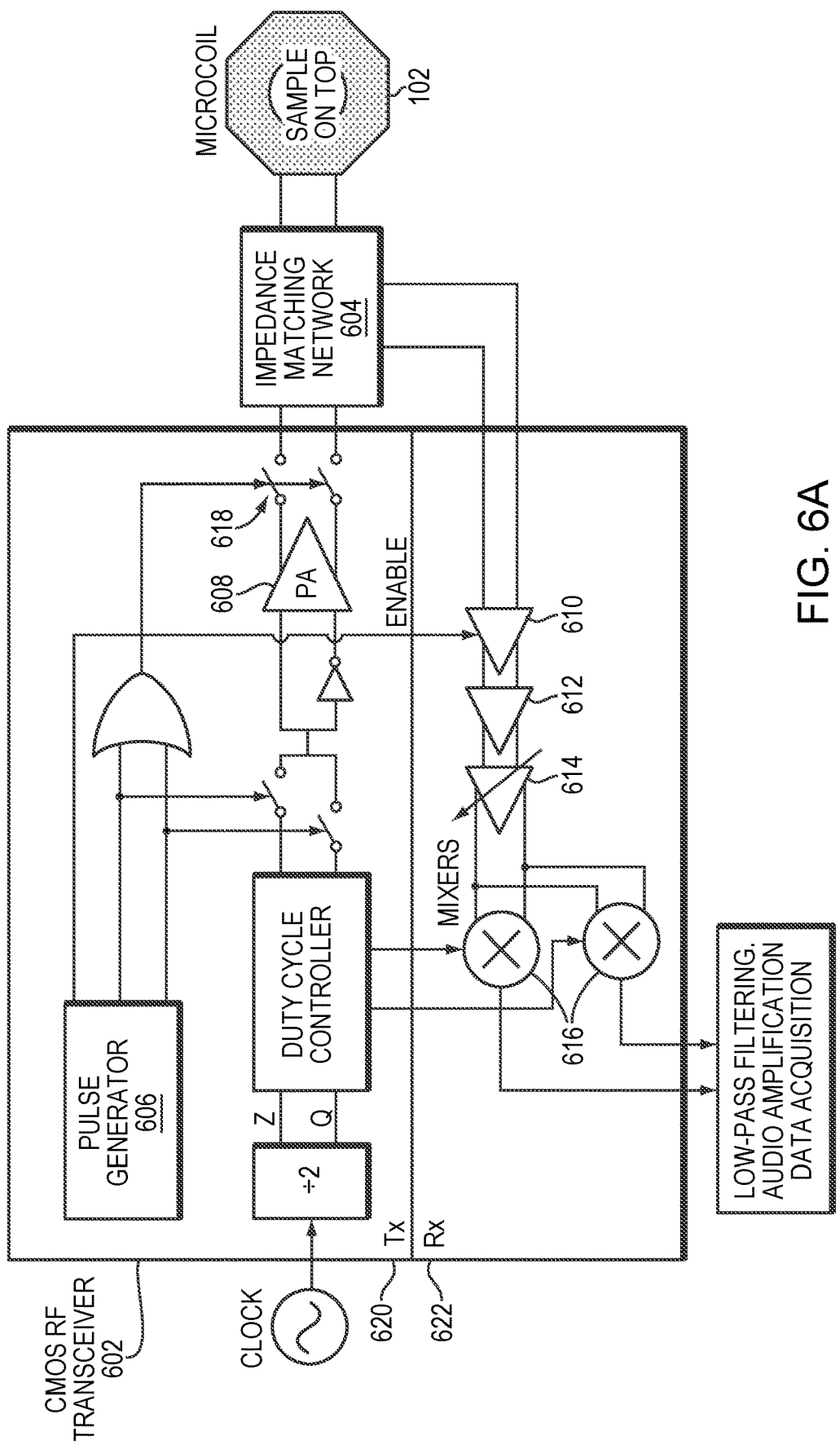
FIG. 6A depicts an exemplary NMR transceiver in accordance with various embodiments.

The time-dependent amplifier gain described above may be provided by amplifier stages implemented in the NMR system 100. Referring to FIG. 6A, in various embodiments, an exemplary NMR transceiver 602 is implemented in a complementary metal-oxide semiconductor (CMOS) integrated circuit (IC) chip. The transceiver 602 is generally coupled to the NMR coil 102 via an impedance-matching network 604. Circuit components of the transceiver 602 typically include a pulse-sequence generator 606, a power amplifier (PA) 608, three amplifier stages 610-614 for amplifying the received NMR signals from the sample, and mixers 616 for down-converting the received signals to a lower frequency in order to relax the requirements on the ADC. In addition, a switch 618 may be included between the PA 608 and the impedance-matching network 604; this switch 618 can connect the RF coil 102 to the transmitter portion 620 or receiver portion 622 of the transceiver 602 as described above so as to transmit an RF signal to the sample 104 and receive an echo signal therefrom.

Figure 6B:
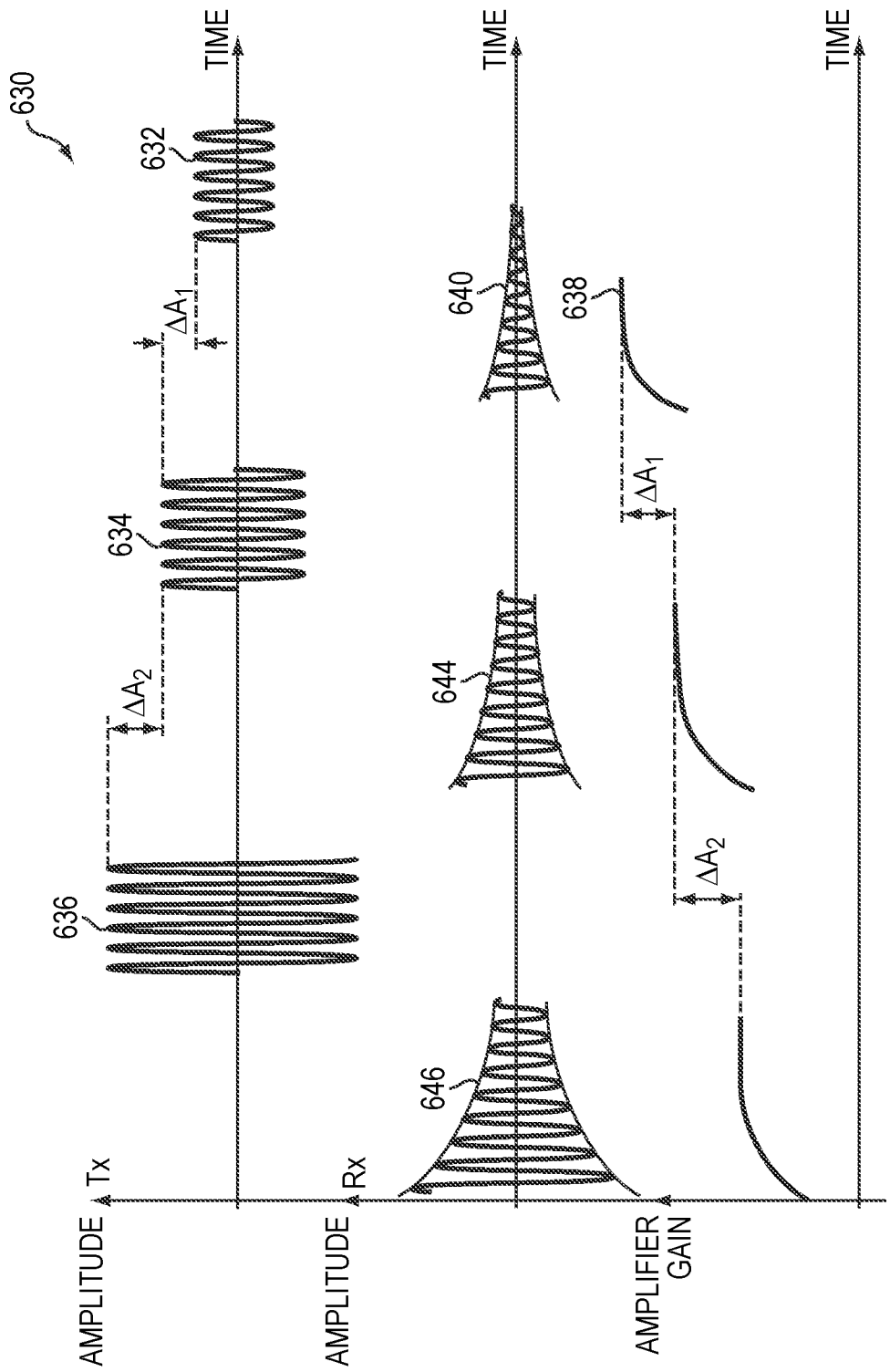
FIG. 6B depicts a pulse-sequence generator including settings of the amplifier gains to be applied to the NMR signals in accordance with various embodiments.

In various embodiments, the three amplifier stages 610-614 include two low-noise amplifiers (LNA) 610, 612 that set the overall noise performance of the receiver 622 and a variable gain amplifier (VGA) (such as a programmable gain amplifier, PGA) 614 for amplification of the NMR signals detected by the coil 102. The VGA 614 may apply a time-dependent amplifier gain to individual NMR signals and/or a dynamically adjusted amplifier gain profile to a series of received NMR signals in a manner as described above. In some embodiments, the pulse-sequence generator 606 includes the gain setting to be used by the VGA 614 during acquisition of the NMR signals. For example, referring to FIG. 6B, the pulse-sequence generator 606 may generate a pulse sequence 630 having pulses 632-636; the amplitudes of the pulses 632-636 may be increased in a step-wise manner and the amplitude difference between two adjacent pulses may be an integer of a regular step size of the VGA 614. For example, the step size of the VGA 614 may be 0.5 decibel (dB); the amplitude difference $\Delta A_1$ between pulses 632 and 634 and $\Delta A_2$ between pulses 634 and 636 may be set by the sequence generator 606 to be 1 and 1.5 dB, respectively. As a result, after the VGA 614 applies an amplifier gain 638 to the received echo signal 640 corresponding to the pulse 632, the VGA 614 may decrease the amplifier gain by two steps—i.e., 1 dB to amplify the echo signal 644 corresponding to the pulse 634. Similarly, after amplification of the signal 644, the VGA 614 may decrease the amplifier gain by another three steps—i.e., 1.5 dB to amplify the echo signal 646 corresponding to the pulse 636.

Figure 7:
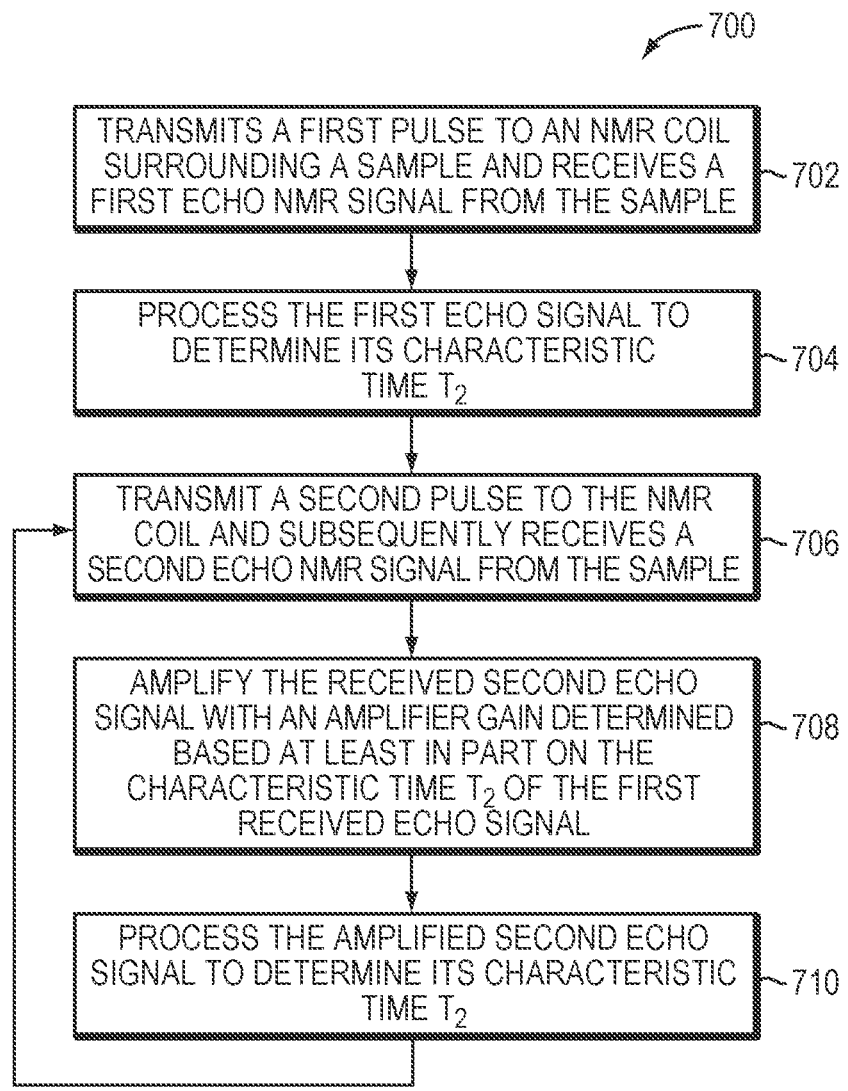
FIG. 7 is a flow chart illustrating an approach for dynamically adjusting the amplifier gain applied to the received signals during NMR measurements in accordance with various embodiments.

FIG. 7 is a flow chart 700 illustrating an approach for dynamically adjusting the amplifier gain of an NMR transceiver during NMR measurements in accordance with various embodiments of the invention. In a first step 702, the NMR transceiver 602 transmits a first pulse to an NMR coil 102 surrounding a sample 104 and receives a first echo NMR signal therefrom. Optionally, the received NMR echo signal may be amplified using a fixed gain or a time-dependent gain (e.g., an exponentially increasing gain or a discretely increasing gain). The value of the fixed gain or a characteristic of the time-dependent gain (e.g., the time constant of the exponential gain or the increase of the discrete gains) may be determined based on the expected material property of the sample and/or the coil (which may be obtained empirically prior to the measurements using any suitable technique and/or from known literature or a look-up table). In a second step 704, the echo signal is processed by the NMR circuitry and analyzed by a controller to determine its characteristic time $T_2$. If the echo signal is amplified, the controller may first apply to the amplified signal a gain function inverse to the applied amplifier gain, and then analyze the resulting signal to compute the actual characteristic time $T_2$ of the received NMR signal. In a third step 706, the NMR transceiver 602 transmits a second pulse to the NMR coil 102 and subsequently receives a second echo NMR signal from the sample. In a fourth step 708, the received second echo signal is amplified using a second time-dependent amplifier gain; the characteristic of the second time-dependent gain (e.g., the time constant of the exponential gain or the discrete increase of the gain) is determined based on the characteristic time $T_2$ of the first received echo signal. Subsequently, the amplified second echo signal is processed to determine its characteristic time $T_2$ (in a fifth step 710). Steps 706-710 may be iteratively performed throughout the entire NMR measurements. As a result, the amplitudes of the received NMR signals are dynamically amplified via adjustment of the amplified gain in accordance with the characteristic time of previously received NMR signal. This approach thus enables the damped portions of the received NMR echo signals to be amplified with a greater degree (compared with amplification using a fixed-gain amplification) based on the actual, real-time measurement of the sample. This allows the NMR signals to be accurately analyzed, which may improve the spectral resolution of the NMR spectrum. It should be noted that the approach 700 described above is for illustration only; any suitable approach to determining the characteristic of the amplifier gain to be applied to the currently received signal based on the preceding signal(s) are within the scope of the present invention. For example, the characteristic of the amplifier gain applied to the current NMR signal may be determined based on an average of two or more characteristic times associated with the preceding echo signals.

In general, functionality for analyzing the received NMR signals (such as computing the characteristic times of the received signals and applying an inverse gain function to the signals) and operating the NMR circuitry (such as causing the transceiver to transmit a sequence of pulses and receive echo signals from the sample and using VGA to apply a fixed or time-vary gain to the received signals) as described above, whether integrated within a controller of the NMR system, or provided by a separate external controller, may be structured in one or more modules implemented in hardware, software, or a combination of both. For embodiments in which the functions are provided as one or more software programs, the programs may be written in any of a number of high level languages such as PYTHON, FORTRAN, PASCAL, JAVA, C, C++, C#, BASIC, various scripting languages, and/or HTML. Additionally, the software can be implemented in an assembly language directed to the microprocessor resident on a target computer (e.g., the controller); for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM. Embodiments using hardware circuitry may be implemented using, for example, one or more FPGA, CPLD or ASIC processors.

In addition, the term "controller" used herein broadly includes all necessary hardware components and/or software modules utilized to perform any functionality as described above; the controller may include multiple hardware components and/or software modules and the functionality can be spread among different components and/or modules.

Certain embodiments of the present invention are described above. It is, however, expressly noted that the present invention is not limited to those embodiments; rather, additions and modifications to what is expressly described herein are also included within the scope of the invention.

What is claimed is:

1. A method of amplifying an NMR signal in response to a transmitted NMR pulse, the method comprising:
   estimating a characteristic time associated with the NMR signal;
   transmitting the NMR pulse to a sample and receiving the NMR signal therefrom;
   applying a time-dependent amplifier gain to the received NMR signal based at least in part on the estimated characteristic time; and
   computing a second characteristic time associated with the amplified NMR signal by applying an inverse gain function to the amplified NMR signal.

2. The method of claim 1, wherein the characteristic time is estimated based on a previous NMR measurement of the sample.

3. The method of claim 1, further comprising analyzing at least a portion of the amplified NMR signals occurring after passage of the second characteristic time.

4. The method of claim 1, further comprising:
   transmitting a second NMR pulse to the sample and receiving the second NMR signal therefrom; and
   applying a second time-dependent amplifier gain to the second NMR signal based at least in part on the second characteristic time.

5. The method of claim 1, wherein the time-dependent amplifier gain comprises a series of discrete gain increases.

6. A method of amplifying an NMR signal in response to a transmitted NMR pulse, the method comprising:
   estimating a characteristic time associated with the NMR signal;
   transmitting the NMR pulse to a sample and receiving the NMR signal therefrom; and
   applying a time-dependent amplifier gain to the received NMR signal based at least in part on the estimated characteristic time,
   wherein the time-dependent amplifier gain comprises an exponential gain profile.

7. The method of claim 6, wherein a time constant of the exponential gain profile and the characteristic time are within an order of magnitude.

8. A method of amplifying an NMR signal in response to a transmitted NMR pulse, the method comprising:
   estimating a characteristic time associated with the NMR signal;
   transmitting the NMR pulse to a sample and receiving the NMR signal therefrom; and
   applying a time-dependent amplifier gain to the received NMR signal based at least in part on the estimated characteristic time,
   wherein the time-dependent amplifier gain comprises a series of discrete gain increases and a profile of the series of discrete gain increases comprises an exponent.

9. An NMR apparatus comprising:
   a transceiver for transmitting an NMR pulse to a sample and receiving an NMR signal therefrom; and
   a controller configured to:

(i) estimate a characteristic time associated with the NMR signal;
(ii) cause the transceiver to transmit the NMR pulse to the sample and receive the NMR signal therefrom;
(iii) cause a time-dependent amplifier gain to be applied to the received NMR signal based at least in part on the estimated characteristic time; and
(iv) compute a second characteristic time associated with the amplified NMR signal by computationally applying an inverse gain function to the amplified NMR signal.

10. The NMR apparatus of claim 9, further comprising a variable-gain amplifier for applying the time-dependent amplifier gain to the received NMR signal.

11. The NMR apparatus of claim 10, wherein the variable-gain amplifier is a programmable-gain amplifier.

12. The NMR apparatus of claim 10, further comprising a pulse-sequence generator having a gain setting associated with gains generated by the variable-gain amplifier.

13. The NMR apparatus of claim 9, wherein the controller is further configured to estimate the characteristic time based on a previous NMR measurement of the sample.

14. The NMR apparatus of claim 9, wherein the controller is further configured to analyze at least a portion of the amplified NMR signals occurring after passage of the second characteristic time.

15. The NMR apparatus of claim 9, wherein the controller is further configured to:
cause the transceiver to transmit a second NMR pulse to the sample and receive the second NMR signal therefrom; and
cause a second time-dependent amplifier gain to be applied to the second NMR signal based at least in part on the second characteristic time.

16. The NMR apparatus of claim 9, wherein the time-dependent amplifier gain comprises a series of discrete gain increases.

17. An NMR apparatus, comprising:
a transceiver for transmitting an NMR pulse to a sample and receiving an NMR signal therefrom;
a controller configured to:
  (i) estimate a characteristic time associated with the NMR signal;
  (ii) cause the transceiver to transmit the NMR pulse to the sample and receive the NMR signal therefrom; and
  (iii) cause a time-dependent amplifier gain to be applied to the received NMR signal based at least in part on the estimated characteristic time;
a variable-gain amplifier for applying the time-dependent amplifier gain to the received NMR signal; and
a pulse-sequence generator having a gain setting associated with gains generated by the variable-gain amplifier,
wherein the pulse-sequence generator generates a plurality of NMR pulses, wherein an amplitude difference between adjacent pulses is determined based at least in part on a step size of the gains generated by the variable-gain amplifier.

18. An NMR apparatus comprising:
a transceiver for transmitting an NMR pulse to a sample and receiving an NMR signal therefrom; and
a controller configured to:
  (i) estimate a characteristic time associated with the NMR signal;
  (ii) cause the transceiver to transmit the NMR pulse to the sample and receive the NMR signal therefrom; and
  (iii) cause a time-dependent amplifier gain to be applied to the received NMR signal based at least in part on the estimated characteristic time;
wherein the time-dependent amplifier gain comprises an exponential gain profile.

19. The NMR apparatus of claim 18, wherein a time constant of the exponential gain profile and the characteristic time are within an order of magnitude.

20. An NMR apparatus comprising:
a transceiver for transmitting an NMR pulse to a sample and receiving an NMR signal therefrom; and
a controller configured to:
  (i) estimate a characteristic time associated with the NMR signal;
  (ii) cause the transceiver to transmit the NMR pulse to the sample and receive the NMR signal therefrom; and
  (iii) cause a time-dependent amplifier gain to be applied to the received NMR signal based at least in part on the estimated characteristic time,
wherein the time-dependent amplifier gain comprises a series of discrete gain increases and a profile of the series of discrete gain increases comprises an exponent.

21. A method of dynamically varying gain amplification of received NMR signals in response to transmitted NMR pulses, each received NMR signal corresponding to a transmitted NMR pulse, the method comprising:
(i) transmitting a first one of the NMR pulses to a sample and receiving therefrom a first one of the NMR signals;
(ii) determining a characteristic time associated with the first one of the NMR signals;
(iii) transmitting a second one of the NMR pulses to the sample and receiving therefrom a second one of the NMR signals; and
(iv) applying a time-dependent amplifier gain to the received second one of the NMR signals based at least in part on the determined characteristic time,
wherein the time-dependent amplifier gain comprises an exponential gain profile.

22. An NMR apparatus comprising:
a transceiver for transmitting NMR pulses to a sample and receiving NMR signals therefrom, each NMR signal corresponding to a transmitted NMR pulse; and
a controller configured to:
(i) cause the transceiver to transmit a first one of the NMR pulses to the sample and receive therefrom the first one of the NMR signals;
(ii) determine a characteristic time associated with the first one of the NMR signals;
(iii) cause the transceiver to transmit a second one of the NMR pulses to the sample and receive therefrom the second one of the NMR signals; and
(iv) cause the transceiver to apply a time-dependent amplifier gain to the received second one of the NMR signals based at least in part on the determined characteristic time,
wherein the time-dependent amplifier gain comprises an exponential gain profile.

* * * * *